United States Patent
Kumar (10) Patent No.: US 12,212,315 B1
(45) Date of Patent: Jan. 28, 2025

(54) INTERFACE DEVICE

(71) Applicant: Cadence Design Systems, Inc., San Jose, CA (US)

(72) Inventor: Vinod Kumar, Pratapgarh (IN)

(73) Assignee: Cadence Design Systems, Inc., San Jose, CA (US)

( * ) Notice: Subject to any disclaimer, the term of this patent is extended or adjusted under 35 U.S.C. 154(b) by 161 days.

(21) Appl. No.: 18/093,281

(22) Filed: Jan. 4, 2023

(51) Int. Cl.
*G11C 5/14* (2006.01)
*H03K 3/011* (2006.01)
*H03K 17/687* (2006.01)
*G11C 11/4093* (2006.01)

(52) U.S. Cl.
CPC ......... *H03K 17/6872* (2013.01); *H03K 3/011* (2013.01); *G11C 11/4093* (2013.01)

(58) Field of Classification Search
CPC . H03K 17/6872; H03K 3/011; G11C 11/4093
USPC .................................................... 365/189.09
See application file for complete search history.

(56) References Cited

U.S. PATENT DOCUMENTS

| | | | | |
|---|---|---|---|---|
| 6,433,585 B1* | 8/2002 | Patel | ............... | H03K 19/00315 326/86 |
| 6,774,696 B2* | 8/2004 | Clark | ............... | H03K 3/356156 327/333 |
| 6,801,064 B1* | 10/2004 | Hunt | ............... | H03K 19/00315 327/333 |
| 7,085,177 B2* | 8/2006 | Savage | ............... | G11C 7/1006 365/189.11 |
| 7,365,569 B1* | 4/2008 | Venugopal | ......... | H03K 3/35613 326/68 |
| 7,570,088 B1* | 8/2009 | Ku | ................... | H03K 19/00315 327/112 |
| 7,737,734 B1* | 6/2010 | Khamesra | ...... | H03K 19/018521 327/108 |
| 8,259,424 B1* | 9/2012 | Lin | ..................... | H03M 1/1295 361/111 |
| 8,482,329 B2* | 7/2013 | Deshpande | .......... | H03K 5/2481 327/205 |

(Continued)

FOREIGN PATENT DOCUMENTS

CN 1862967 A * 11/2006 ....... H03K 19/00315

OTHER PUBLICATIONS

Marcel Kossel et al, "A DDR3/4 Memory Link TX Supporting 24-40, 0.8-1.6 V, 0.8-5.0 Gb/s with Slew Rate Control and Thin Oxide Output Stages in 22-nm CMOS SOI", Sep. 2014, IEEE Explore, pp. 136-138. (Year: 2014).*

*Primary Examiner* — Viet Q Nguyen
(74) *Attorney, Agent, or Firm* — Schwegman Lundberg & Woessner, P.A.

(57) ABSTRACT

Methods and systems are provided for transmitting data using thin-oxide devices. The methods and system generate a first bias voltage and a second bias voltage based on a power supply voltage of the second voltage domain, the first bias voltage value representing a high-level voltage signal of the first voltage domain, and the second bias voltage representing a low-level voltage signal of the second voltage domain and its value corresponds to a difference between the second voltage domain and the first voltage domain. The methods and systems generate an output of the thin-oxide device interface using first and second thin-oxide devices, the output of the thin-oxide device interface having a range corresponding to the second voltage domain.

20 Claims, 8 Drawing Sheets

(56) References Cited

U.S. PATENT DOCUMENTS

| | | | |
|---|---|---|---|
| 8,766,680 B2* | 7/2014 | Tang | H03L 7/0995 |
| | | | 326/62 |
| 9,245,597 B2* | 1/2016 | Guo | G11C 13/0038 |
| 9,252,765 B2* | 2/2016 | Terzioglu | G11C 7/00 |
| 9,678,524 B2* | 6/2017 | Pisasale | G05F 3/26 |
| 9,754,646 B1* | 9/2017 | Kumar | G11C 7/1093 |
| 10,075,157 B1* | 9/2018 | Den Hartog | H03K 19/00315 |
| 10,256,820 B2* | 4/2019 | Duby | H03K 3/356182 |
| 11,942,942 B1* | 3/2024 | Chan | H01L 29/1045 |
| 2004/0061527 A1* | 4/2004 | Knee | H03K 19/09432 |
| | | | 326/87 |
| 2005/0212558 A1* | 9/2005 | Chung | H03K 19/00315 |
| | | | 326/81 |
| 2007/0159218 A1* | 7/2007 | Srinivas | H03K 3/356104 |
| | | | 327/108 |
| 2013/0106474 A1* | 5/2013 | Kossel | H01L 27/0266 |
| | | | 327/142 |
| 2019/0109588 A1* | 4/2019 | Lee | H03K 19/017509 |
| 2023/0238956 A1* | 7/2023 | Chen | H03K 3/3565 |
| | | | 327/205 |
| 2024/0014242 A1* | 1/2024 | Ledvina | H01L 27/14634 |
| 2024/0096412 A1* | 3/2024 | Conte | G11C 13/0028 |
| 2024/0144980 A1* | 5/2024 | Msryan | G11C 11/4093 |

* cited by examiner

FIG. 8

INTERFACE DEVICE

TECHNICAL FIELD

The present disclosure generally relates to the technical field of circuit design and integrated circuits (ICs). In particular, the present disclosure addresses systems and methods for using thin-oxide devices to transmit signals between low-voltage domain components and high-voltage domain components.

BACKGROUND

An IC layout specifies portions of various components of an IC. An IC typically includes registers, latches, flip-flops multipliers, and/or other types of clocked devices. Certain ICs can be implemented using thin-oxide devices while other ICs are implemented using thick-oxide devices. The thin-oxide devices typically operate at a much lower threshold voltage (turn-on voltage) than the thick-oxide devices. Thus, managing the voltage levels of the signals these devices exchange is an important aspect of circuit design.

BRIEF DESCRIPTION OF THE DRAWINGS

To easily identify the discussion of any particular element or act, the most significant digit or digits in a reference number refer to the figure number in which that element is first introduced.

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Electronic design automation (EDA) software systems commonly perform level shifting operations to handle communication of signals between different physical components. Specifically, one or more core devices which can be implemented using thin-oxide devices (transistors) can be used to implement various processors. Other devices, such as thick-oxide devices (transistors) can be used to implement memory that is coupled to the various processors. Typical systems employ an I/O buffer or signal transmitter that is implemented using a mix of thin-oxide and thick-oxide devices to manage and shift the voltage levels of the signals exchanged between the thin-oxide and thick-oxide devices. Implementing both thin-oxide and thick-oxide devices on a single physical component can be very challenging. Particularly, thin-oxide devices use one process and fabrication technology that differs from the process and fabrication technology used to implement thick-oxide devices. Thus, applying both processes and fabrication technologies to the same physical device, component or chip can introduce complexities and increase costs and time to manufacture the devices.

In addition, as the technology is shrinking, the operating voltage range of devices is reduced. However, the operating voltage of external interface devices remains the same. Many of the advance technology nodes fail to support thick-oxide devices and have only the thin-oxide devices, also known as core devices, which can tolerate only lower voltage stress. Typically, input/output (IO) buffers connect the core of the chip operating at lower voltage with the external peripheral devices operating at the higher voltage. For example, certain types of DRAM memory devices operate at a higher supply voltage, such as 1.35V or 1.1V (VDDQ domain) while the processor cores operate at a 0.75V supply voltage (VDD domain). In the advance technology nodes where only thin-oxide devices are available, it becomes challenging to design a high-speed IO buffer by using only the thin-oxide devices. Typical devices employ thin-oxide and thick-oxide devices to establish a link between the processor and memory devices by taking VDD domain input signals and converting the signals to the VDDQ domain output signal and vice versa. The combination of thin-oxide and thick-oxide devices ensure the reliability of the devices used in the transmitter (e.g., the interface devices). However, thick-oxide devices operate at a much slower speed especially when the VDDQ supply voltage becomes smaller, which limits the overall speed of the transmitter. As such, the speed at which the processor cores can communicate with the external peripheral devices or components becomes limited by the speed of the interface devices.

Embodiments of the present disclosure are directed to a circuit design and system that implement techniques for improving, and speed up the exchange of, signals between core devices operating in a first voltage domain (e.g., VDD) and devices operating in a second voltage domain (VDDQ). The disclosed circuit and system architecture provides an interface device (e.g., transmitter) that is implemented using only thin-oxide devices and can still handle the generation of signals at the second voltage domain. In some cases, an always ON reference voltage generator circuit (which is not impacted or affected by transitions in the power supply voltage) is provided to generate a reference voltage derived from VDDQ supply to protect the thin-oxide devices from voltage stress. In this way, embodiments of the present disclosure provide a transmitter that can transmit signals received in the first voltage domain to output signals corresponding to the second voltage domain without exceeding the operating voltages of the thin-oxide devices. This allows signals to be exchanged at a much faster rate, which improves the overall functioning of the device.

In some examples, the disclosed techniques provide a thin-oxide device interface for transmitting an input signal received from a first component operating in a first voltage domain and to a second component operating in a second voltage domain via an output of the thin-oxide device interface. The thin-oxide device includes a voltage generation circuit configured to generate a first bias voltage and a second bias voltage based on a power supply voltage of the second voltage domain, the first bias voltage value representing a high-level voltage signal of the first voltage domain, and the second bias voltage representing a low-level voltage signal of the second voltage domain and its value corresponds to a difference between the second voltage domain and the first voltage domain. The thin-oxide device includes a first thin-oxide device having a gate coupled to the first bias voltage, a first node of the first thin-oxide device being coupled to a first adjusted version of the input signal and a second node of the first thin-oxide device being coupled to the output of the thin-oxide device interface. The thin-oxide device includes a second thin-oxide device having a gate coupled to the second bias voltage, a first node of the second thin-oxide device being coupled to a second adjusted version of the input signal and a second node of the second thin-oxide device being coupled to the output of the thin-oxide device interface.

In some examples, the output of the thin-oxide device interface, generated by the first and second thin-oxide devices, has a range corresponding to the second voltage domain. The first voltage domain corresponds to a first operating level of thin-oxide devices and the second voltage domain corresponds to a second operating level of thick-oxide devices. In some examples, the thin-oxide device interface includes a memory interface.

In some examples, the first component includes one or more processors and the second component includes a memory device. In some examples, the thin-oxide device interface includes a pull-up driver coupled to the input signal and configured to generate the first adjusted version of the input signal. The first adjusted version of the input signal transitions between the second bias voltage to represent a high logic level of the input signal and the power supply voltage of the second voltage domain to represent a low logic level of the input signal.

In some examples, the thin-oxide device interface includes a pull-down driver coupled to the input signal and configured to generate the second adjusted version of the input signal. The second adjusted version of the input signal transitions between a ground voltage to represent the high logic level of the input signal and the first bias voltage to represent a low logic level of the input signal. In some examples, the pull-down driver includes a plurality of cascode thin-oxide NMOS devices.

In some examples, the pull-up driver is configured to generate the first adjusted version of the input signal based on a value corresponding to a manufacturing process, voltage and temperature (PVT) parameter of the thin-oxide device interface. In some examples, the pull-down driver is configured to generate the second adjusted version of the input signal based on a value corresponding to a PVT parameter of the thin-oxide device interface.

In some examples, individual branches of transistors within the pull-down driver are selectively enabled based on the value corresponding to the PVT parameter of the thin-oxide device interface. In some examples, the thin-oxide device interface includes a charge pump level shifter, wherein the pull-up driver is coupled to the input signal via the charge pump level shifter. The charge pump level shifter is configured to adjust a level of the input signal, such that the high logic level of the input signal is represented by the power supply voltage of the second voltage domain and the low logic level of the input signal is represented by the second bias voltage.

In some examples, the thin-oxide device interface includes: a buffer, wherein the pull-down driver is coupled to the input signal via the buffer. The buffer is configured to adjust a level of the input signal, such that the high logic level of the input signal is represented by the first bias voltage and the low logic level of the input signal is represented by the ground voltage. In some examples, the first thin-oxide device includes a cascode PMOS transistor and the second thin-oxide device includes a cascode NMOS transistor.

In some examples, the voltage generation circuit includes a first voltage divider configured to generate a common reference voltage component including the first bias voltage and the second bias voltage. The common reference voltage component is distributed to a plurality of portions of the thin-oxide device interface, each portion of the plurality of portions corresponding to a different data slice of a plurality of data slices of the input signal. The voltage generation circuit includes a second voltage divider configured to generate a distributed reference voltage for each bit of the input signal within each of the plurality of portions. The distributed reference voltage includes the first bias voltage and the second bias voltage.

In some examples, the second voltage divider includes first and second transistors coupled to an output of a level shifter. A gate of the first transistor is configured to receive a first signal between the power supply voltage of the second voltage domain and the second bias voltage. A gate of the second transistor is configured to receive a second signal between the first bias voltage and ground. In some examples, the first and second transistors selectively enable the second voltage divider.

Reference will now be made in detail to specific example embodiments for carrying out the disclosed subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Figure 1:
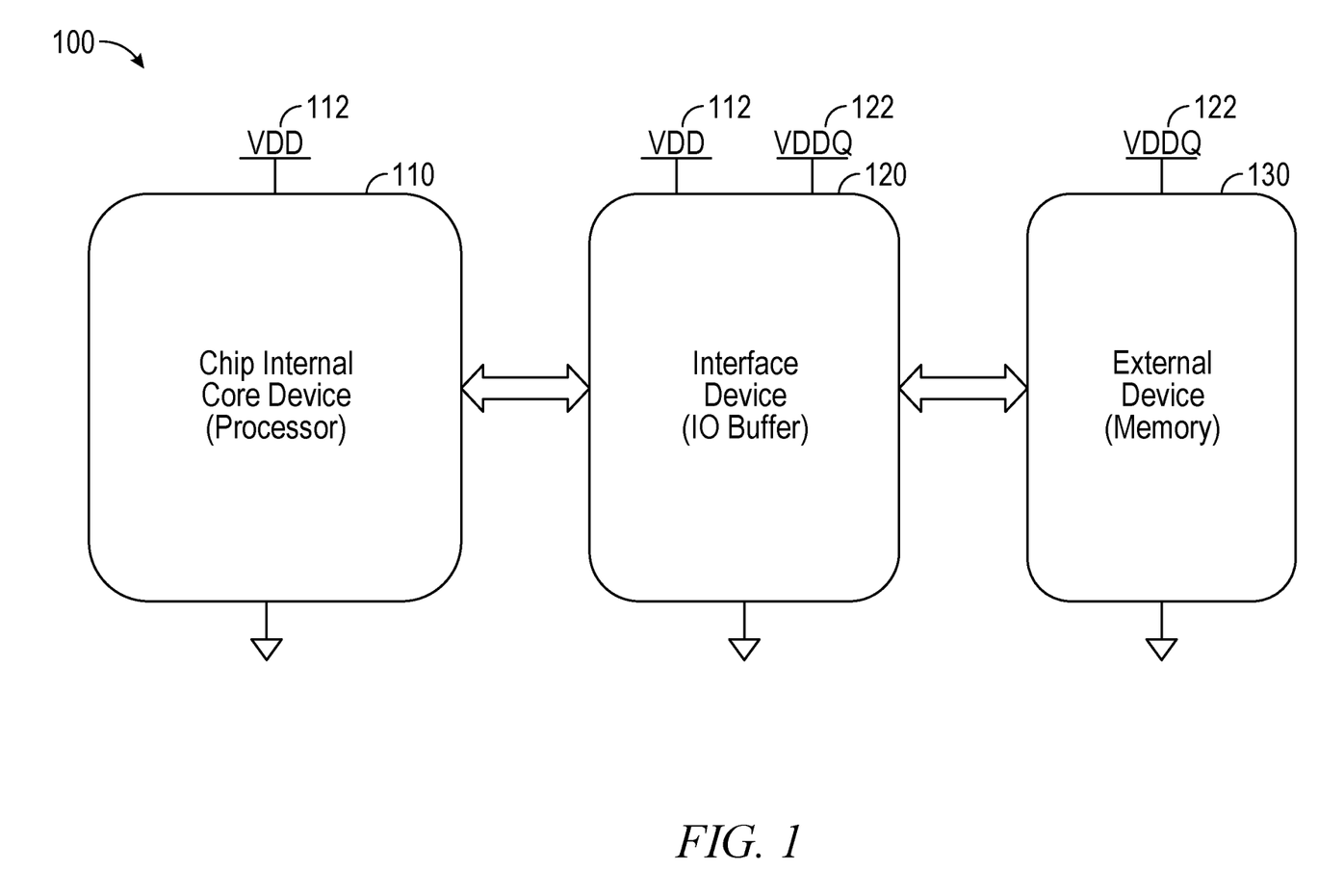
FIG. 1 illustrates an example circuit design having a mix of thin-oxide and thick-oxide devices, in accordance with some embodiments.

FIG. 1 illustrates an example circuit design 100 having a mix of thin-oxide and thick-oxide devices, in accordance with some embodiments. Specifically, the circuit design 100 includes a processor 110, an interface device 120, and an external device 130. In some cases, the processor 110 may be implemented in whole or in part using exclusively or only one or more thin-oxide devices or a mix of thin-oxide and thick-oxide devices. The thin-oxide devices may be implemented using 0.18 micrometer technology and have a thickness of approximately 3 nanometers. The thin-oxide devices of the processor 110 may operate using a first power supply voltage corresponding to a first voltage domain, such as 0.75 volts (V) or 1.8V. Such thin-oxide devices may fail to operate properly when a gate of a transistor of such devices receives a voltage greater than the first power supply voltage of the first voltage domain, referred to herein as VDD 112. In some cases, the thin-oxide devices may fail to operate properly when a voltage drop between the gate of the transistor of such devices and one of the other nodes (e.g., a source or drain, Vgs or Vgd) exceeds the value of the power supply voltage of the first voltage domain.

In some examples, the processor 110 may need to communicate with other components external to the processor 110, such as the external device 130. For example, the external device 130 may include a memory, such as dynamic random access memory (DRAM), which is implemented using thick-oxide devices. The thick-oxide devices may be implemented using different process technology than the process technology used to implement the thin-oxide devices and may have a thickness of approximately 7 nanometers. The thick-oxide devices may operate using a second power supply voltage corresponding to a second voltage domain, such as 1.35V. Such thick-oxide devices may fail to operate properly or react to signals when a gate of a transistor of such devices receives a voltage lower than the second power supply voltage of the second voltage domain, referred to herein as VDDQ 122.

The logic signals generated by the processor 110 may be in the first voltage domain and cannot be directly sent to the external device 130. Namely, providing signals to the external device 130 in the first voltage domain may cause the external device 130 to fail to respond or operate properly when receiving such signals. In such cases, the interface device 120 (also referred to as a transmitter) may be used to convert voltage levels of the logic signals received from the processor 110 into the corresponding voltage domain of the external device 130 and vice versa. The interface device 120 may include circuitry that converts input signals from the first voltage domain to output signals in the second voltage domain. In this way, the processor 110 can communicate with the external device 130 via the interface device 120 and the external device 130 can communicate with the processor 110 via the interface device 120.

In some implementations, the interface device 120 is implemented using only thin-oxide devices. The interface device 120 can include a reference voltage generator that generates first and second bias voltage signals based on the VDDQ 122 independently of any power state transitions of a first voltage domain power supply voltage VDD 112. The first bias voltage signal value can represent a power supply voltage VDD 112 of the first voltage domain and the second bias voltage signal value can represent a difference between the power supply voltage VDDQ 122 of the second voltage domain and the power supply voltage VDD 112 of the first voltage domain. The first and second bias voltage signals are being used to prevent thin-oxide devices of the interface device 120 from operating in the second voltage domain (e.g., to prevent a voltage drop across the gate and source/drain of such devices from exceeding the voltage level of the first voltage domain) to continue proper operation. The interface device 120 converts an input signal received from the processor 110 (or other component operating in the first voltage domain) from the first voltage domain to the second voltage domain without operating any of the thin-oxide devices of the interface device 120 in the second voltage domain.

Figure 2:
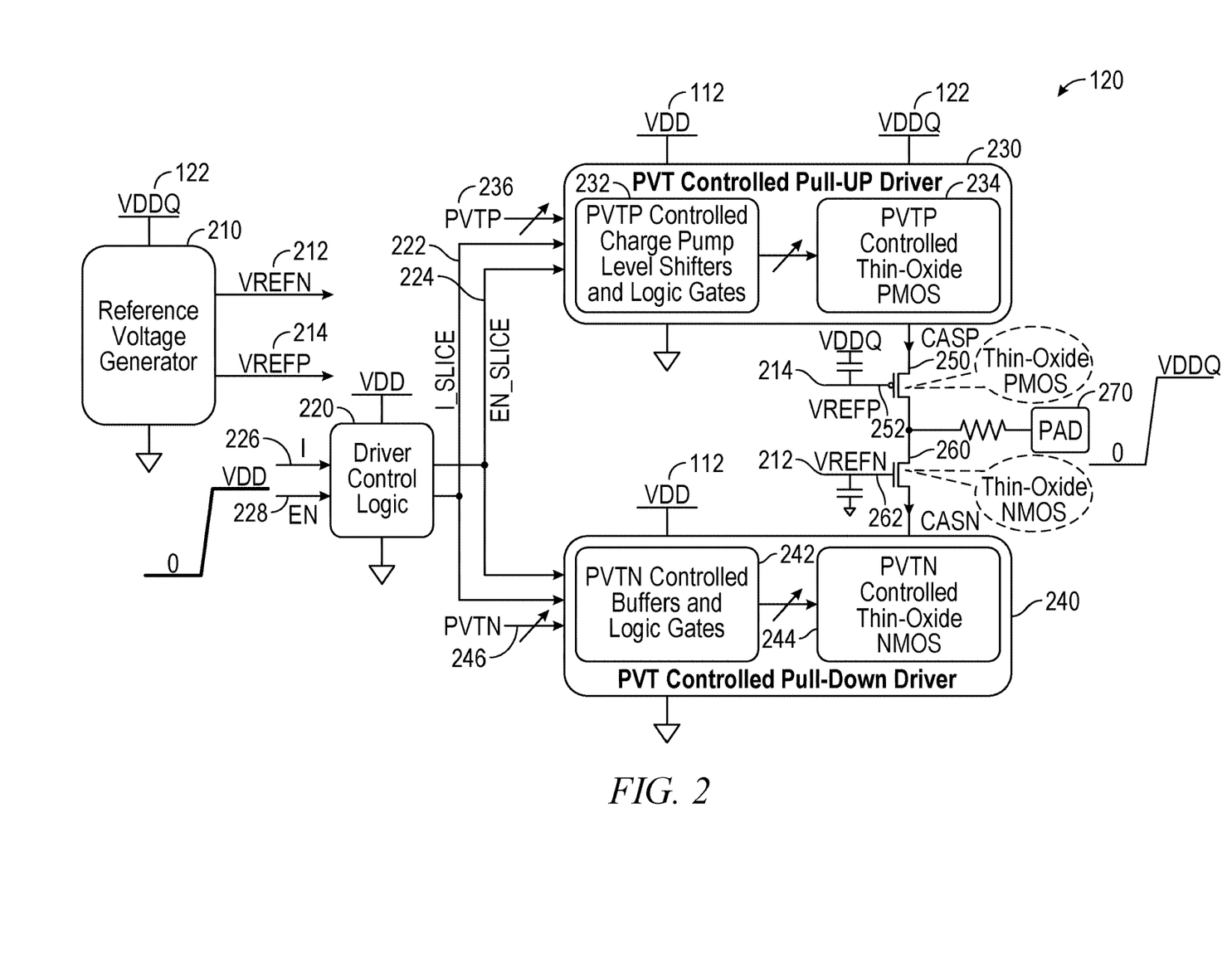
FIG. 2 is a diagram illustrating an example interface device, in accordance with some embodiments.

FIG. 2 is a diagram illustrating an example implementation of at least a portion of the interface device 120, in accordance with some embodiments. In some examples, the interface device 120 includes a reference voltage generator 210, driver control logic 220, a pull-up driver 230, a pull-down driver 240, a PMOS device 250, an NMOS device 260, and an output node 270 (e.g., an output PAD). Some or all of the components shown in FIG. 2 may be implemented only by thin-oxide devices.

In some examples, the reference voltage generator 210 receives the VDDQ 122 of the second voltage domain and generates a first voltage bias signal 212 (VREFN) and a second voltage bias signal 214 (VREFP). The first voltage bias signal 212 value can represent a power supply voltage VDD 112 of the first voltage domain and the second voltage bias signal 214 value can represent a difference between the power supply voltage VDDQ 122 of the second voltage domain and the power supply voltage VDD 112 of the first voltage domain. The first voltage bias signal 212 and the second voltage bias signal 214 can be provided to various components of the interface device 120 along with VDD 112 and VDDQ 122.

Figure 5:
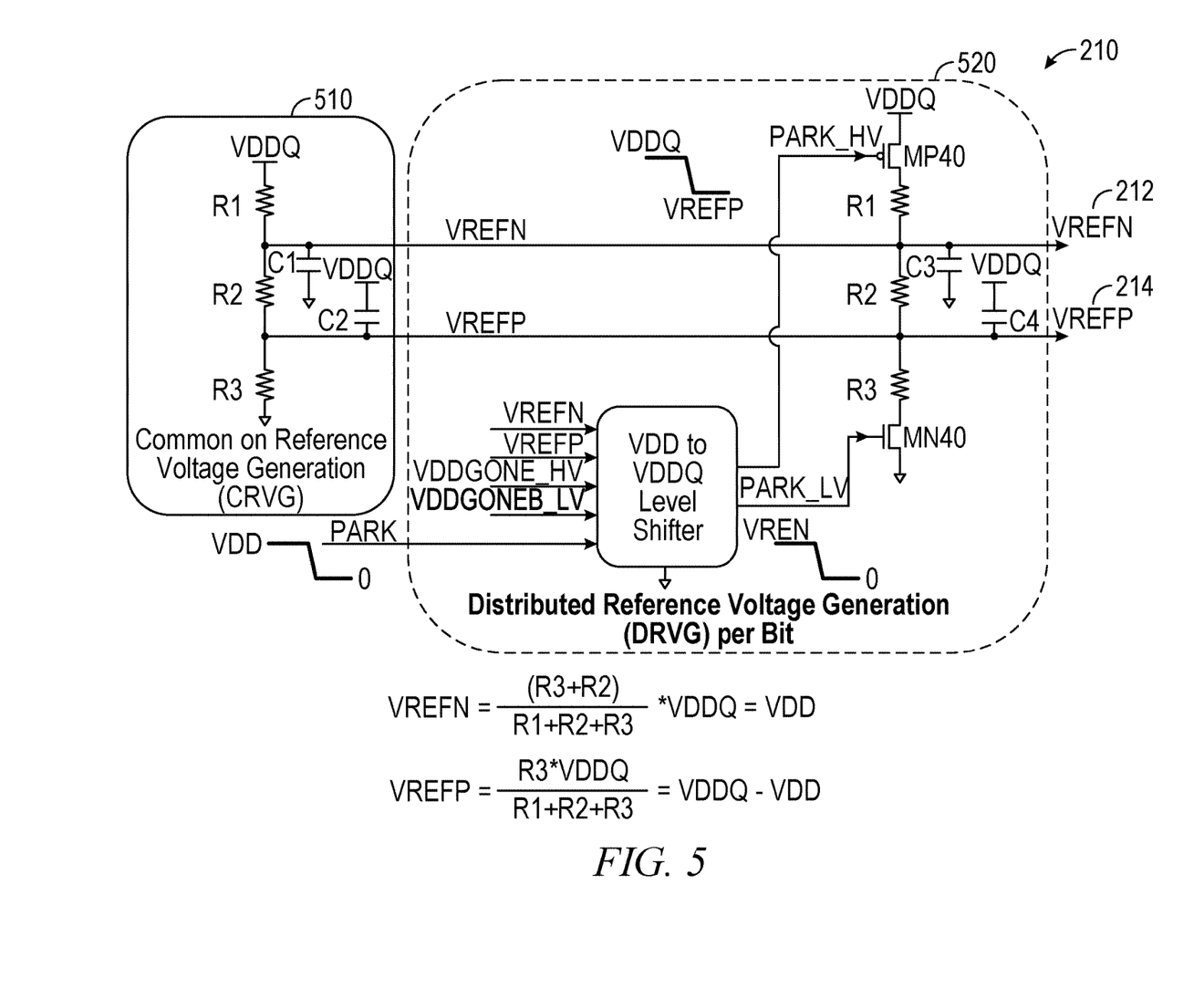
FIG. 5 illustrates an example reference voltage generator, in accordance with some embodiments.

FIG. 5 illustrates an example reference voltage generator 210, in accordance with some embodiments. The reference voltage generator 210 generates the reference voltage signal VREFP to protect the core PMOS devices (e.g., the thin-oxide devices of the processor 110 and/or the interface device 120) from voltage stress and generates the voltage reference signal VREFN to protect the core NMOS devices (e.g., the thin-oxide devices of the processor 110 and/or the interface device 120) from voltage stress.

As shown in FIG. 5, the reference voltage generator 210 includes a first voltage divider circuit 510 that includes a plurality of resistors R1, R2, and R3 coupled in series to the VDDQ 122. The resistor values can be selected such that the first voltage bias signal 212 provided by a node between resistor R1 and resistor R2 corresponds to the value of the power supply voltage of VDD 112. The resistor values can be selected such that the second voltage bias signal 214 provided by a node between resistor R2 and resistor R3 corresponds to a difference between the power supply voltage VDDQ 122 and the value of the power supply voltage of VDD 112. In an example, the first voltage bias signal 212 and the values of the resistors can be computed in accordance with VDD=VDDQ*(R2+R3)/(R1+R2+R3). In an example, the second voltage bias signal 214 and the values of the resistors can be computed in accordance with VDDQ−VDD=VDDQ*(R3)/(R1+R2+R3). The second voltage bias signal 214 can be of a lower value than the first voltage bias signal 212. Since the reference voltage generator 210 generates the first voltage bias signal 212 and the second voltage bias signal 214 based on the VDDQ 122, the reference voltage generator 210 is independent of changes in the state of the power supply voltage VDD 112. In this way, the reference voltage generator 210 is an always ON device which helps protect against transients and errors encountered during power sequencing of the VDD 112 (e.g., turning ON/OFF the VDD 112).

The output of the first voltage divider circuit 510 includes a common reference voltage (CRVG) component that includes the first voltage bias signal 212 and the second voltage bias signal 214. The CRVG is delivered to various slices of the interface device 120. Particularly, the interface device 120 includes multiple instances of the circuitry shown in FIG. 2. Each instance can implement or be used to exchange bits of different respective slices of the data signals. The CRVG is delivered to each of the various instances of the circuitry shown in FIG. 2. The CRVG is used to limit the voltage stress across the thin-oxide devices when the interface device 120 is operating in idle mode. The first voltage divider circuit 510 is used only once in the design and the generated reference voltages are routed to each interface device 120 in the PHY (physical communication device).

In some examples, the reference voltage generator 210 also includes a second voltage divider circuit 520. The second voltage divider circuit 520 includes similar components as the first voltage divider circuit 510 and is configured to receive the first voltage bias signal 212 and second voltage bias signal 214 and/or is configured to similarly generate the first voltage bias signal 212 and the second voltage bias signal 214 using the same arrangement of resistors as the first voltage divider circuit 510. The second voltage divider circuit 520 can be configured to individually generate the first voltage bias signal 212 and the second voltage bias signal 214 within each bit of each slice of each instance of the circuit shown in FIG. 2 and deliver the first voltage bias signal 212 and the second voltage bias signal 214 as a distributed reference voltage (DRVG). Particularly, the second voltage divider circuit 520 can be implemented separately by each instance. The second voltage divider circuit 520 includes a pair of transistors that selectively enable the generation of the first voltage bias signal 212 and the second voltage bias signal 214 when the respective slice is active and being used to generate an output signal for the output node 270. The DRVG is repeated inside of each bit to lower the impedance of the reference voltage during normal high-speed operation.

The second voltage divider circuit 520 can be implemented and used locally inside each instance of the interface device 120 to reduce the effective output impedance of the first voltage bias signal 212 and the second voltage bias signal 214 during normal data traffic so that the impact of noise due to driver switching is minimized, which also helps to reduce jitter in the transmitter data path. In some cases, the value of the first voltage bias signal 212 is computed as a function of PVT conditions and the VDDQ. In some cases, the value of the second voltage bias signal 214 is computed as a function of PVT conditions and a difference between the VDDQ and the VDD supply levels.

The second voltage divider circuit 520 includes a VDD to VDDQ level shifter 530 that receives a park signal, a VDDGONE_HV signal, a VDDGONEB_LV signal, the first voltage bias signal 212 and the second voltage bias signal 214 from the first voltage divider circuit 510.

The VDDQ level shifter 530 is configured to generate a PARK_HV signal and a PARK_LV signal based on a PARK signal received from a controller. The PARK signal controls the activation and enablement of the DRVG signal for particular bits. In some cases, the VDDQ level shifter 530 receives the PARK signal in the first voltage domain. Namely, the PARK signal can represent a logic high value by a VDD voltage value and a logic low value by a ground voltage. The VDDQ level shifter 530 generates the PARK_HV signal to represent a logic high value of the PARK signal as the VDDQ voltage level and a logic low value of the PARK signal as the VREFP voltage level. The VDDQ level shifter 530 generates the PARK_LV signal to represent a logic high value of the PARK signal as the VREFN voltage level and a logic low value of the PARK signal as the ground voltage level.

A power supply ON/OFF detector in the VDDQ level shifter 530 is configured to detect a change in a power state of the power supply voltage VDD 112. The power supply ON/OFF detector generates a VDDGONE_HV signal and a VDDGONEB_LV signal in response to and indicating the change in the power state of the power supply voltage VDD 112. The VDDGONE_HV signal and the VDDGONEB_LV signal are provided to the VDDQ level shifter 530 to ensure that signals generated by the VDDQ level shifter 530 continue to be output without transients and at suitable levels. The second voltage divider circuit 520 selectively enables transistors based on the PARK_HV and PARK_LV signals to control the output of the first voltage bias signal 212 and the second voltage bias signal 214 at each individual bit of respective data slices of the interface device 120.

Referring back to FIG. 2, the driver control logic 220 receives an enable signal 228 and a data input signal 226. The driver control logic 220 controls whether devices within a particular instance of the interface device 120 are active or enabled for a particular data slice. Namely, when the enable signal 228 is in the disabled state, the components within the instance of the interface device 120 corresponding to the particular data slice are set to the idle state to reduce power consumption. The enable signal 228 controls whether the data input signal 226 is provided to the pull-up driver 230 and the pull-down driver 240 of the instance of the interface device 120 corresponding to the data slice of the data input signal 226 by generating the EN_SLICE signal 224 corresponding to the enable signal 228. When the EN_SLICE signal 224 is in the enabled state, the pull-up driver 230 and the pull-down driver 240 are activated and generate CASP and CASN signals corresponding to a slice portion 222 (I_SLICE) of the data input signal 226. When the EN_SLICE signal 224 is in the disabled state, the pull-up driver 230 and the pull-down driver 240 generate CASP and CASN signals corresponding to an idle state.

The pull-up driver 230 receives a PVTP control signal 236 from a controller. The PVTP control signal 236 includes a code representing process, voltage, and temperature of the interface device 120. Based on the PVTP control signal 236, the pull-up driver 230 generates a CASP signal corresponding to the slice portion 222. Similarly, pull-down driver 240 receives a PVTN control signal 246 from a controller. The PVTN control signal 246 includes a code representing process, voltage, and temperature of the interface device 120. Based on the PVTN control signal 246, the pull-down driver 240 generates a CASN signal corresponding to the slice portion 222.

Figure 3:
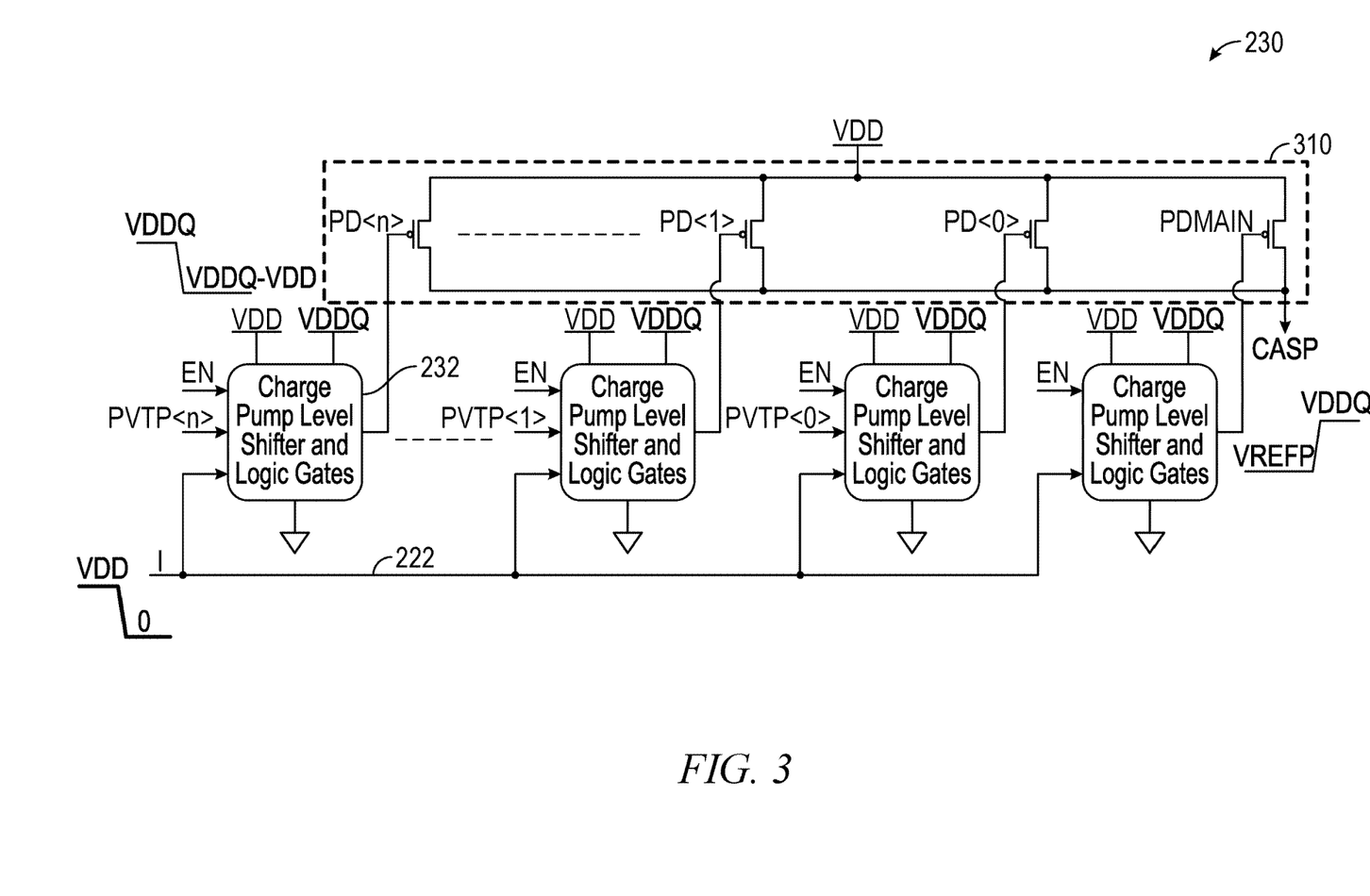
FIG. 3 is a diagram illustrating an example pull-up driver of the interface device implemented using thin-oxide devices, in accordance with some embodiments.

In some cases, the pull-up driver 230 includes a set of charge pump level shifters and logic gates 232 and thin-oxide PMOS devices 234. For example, as shown in FIG. 3, the pull-up driver 230 includes multiple instances of the logic gates 232 and a plurality of PMOS devices 310 corresponding to the thin-oxide PMOS devices 234. The logic gates 232 receive the PVTP control signal 236 and the slice portion 222 (which can include the data input signal 226) and generate a set of signals that are coupled to the gates of the PMOS devices 310. Particularly, a first instance of the logic gates 232 generates a first signal corresponding to a first bit of the slice portion 222 and the first signal is coupled to the gate of a first PMOS device of the PMOS devices 310. A second instance of the logic gates 232 generates a second signal corresponding to a second bit of the slice portion 222 and the second signal is coupled to the gate of a second PMOS device of the PMOS devices 310. The logic gates 232 are configured to generate an output signal coupled to the gates of the PMOS devices 310 that is at a VDDQ voltage level when the slice portion 222 is at a logic high corresponding to the VDD voltage level. The logic gates 232 are configured to generate the output signal, coupled to the gates of the PMOS devices 310, that has a VDDQ-VDD voltage level when the slice portion 222 is at a logic low corresponding to the ground voltage level.

In some examples, first nodes (e.g., the sources/drains) of the PMOS devices 310 are coupled together to generate the CASP output signal of the pull-up driver 230. Second nodes (e.g., the sources/drains) of the PMOS devices 310 are coupled together and are configured to receive the VDDQ supply voltage. The pull-up driver 230 is configured to generate the CASP signal that has a VREFP voltage level when the slice portion 222 is at a logic high corresponding to the VDD voltage level. The pull-up driver 230 is configured to generate the CASP signal that has a VDDQ voltage level when the slice portion 222 is at a logic low corresponding to the ground voltage level.

The CASP signal is coupled to a first node of the PMOS device 250 (e.g., a thin-oxide cascode transistor). A gate 252 of the PMOS device 250 is coupled to the second voltage bias signal 214. A second node of the PMOS device 250 is coupled to the output node 270 and generates the output signal of the interface device 120. In some examples, the PMOS device 250 generates the output signal that transitions between a ground level and the VDDQ level in correspondence with the voltage levels of the data input signal 226. By biasing the gate 252 of the PMOS device 250 with the second voltage bias signal 214, the PMOS device 250 is prevented from operating outside of the operating voltage of the PMOS device 250. Namely, when the second node of the PMOS device 250 is at the VDDQ level, the gate 252 is biased at the second voltage bias signal 214 which prevents a voltage drop between the gate 252 and the second node from exceeding the maximum operating voltage of the PMOS device 250. Similarly, when the first node of the PMOS device 250 is at the VDDQ level (e.g., when the CASP of the pull-up driver 230 is at the VDDQ voltage level), the gate 252 is biased at the second voltage bias signal 214 which prevents a voltage drop between the gate 252 and the first node from exceeding the maximum operating voltage of the PMOS device 250.

Figure 4:
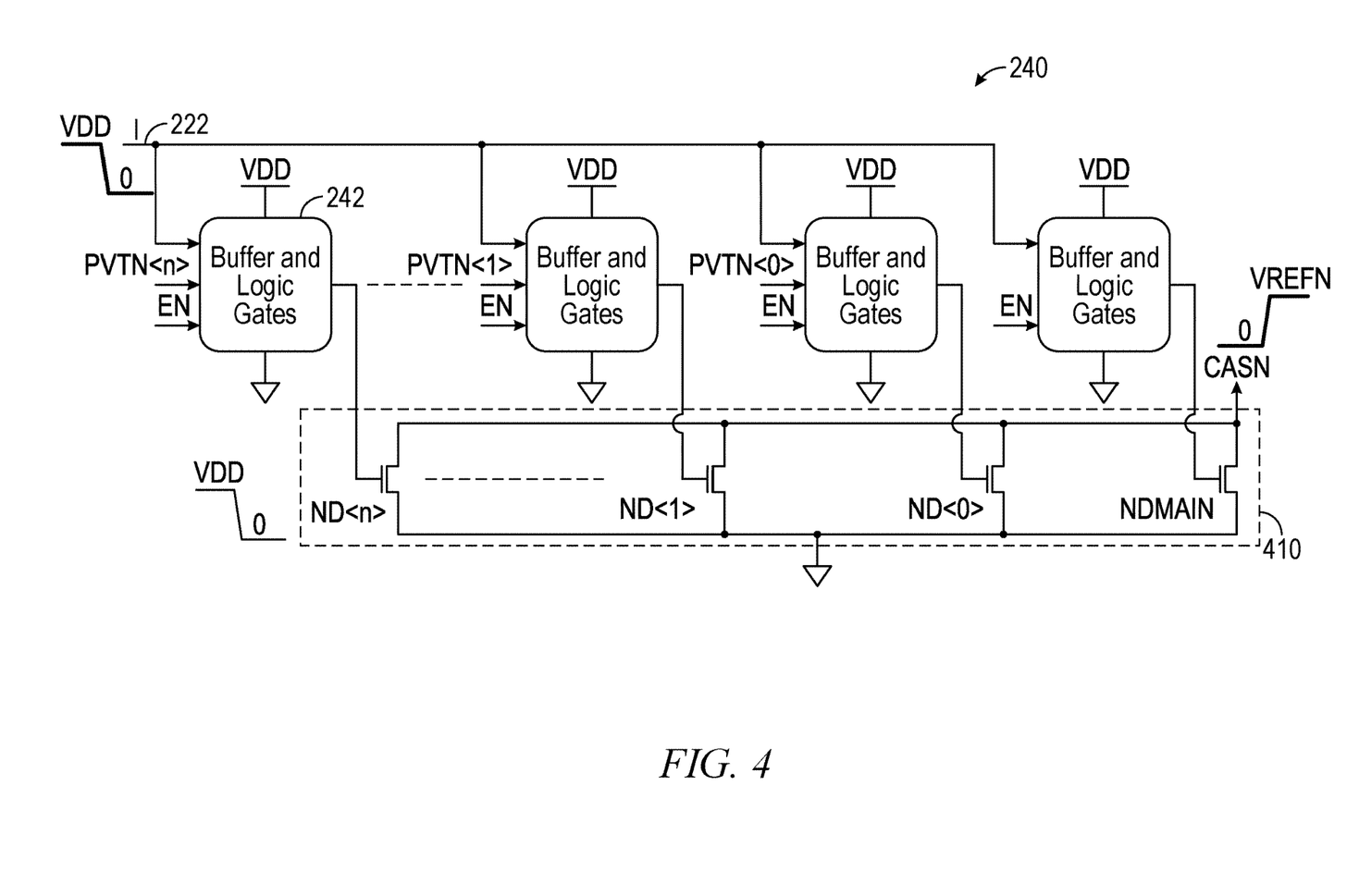
FIG. 4 is a diagram illustrating an example pull-down driver of the interface device implemented using thin-oxide devices, in accordance with some embodiments.

In some cases, the pull-down driver 240 includes a set of buffers and logic gates 242 and thin-oxide NMOS devices 244. For example, as shown in FIG. 4, the pull-down driver 240 includes multiple instances of the logic gates 242 and a plurality of NMOS devices 410 corresponding to the thin-oxide NMOS devices 244. The logic gates 242 receive the PVTN control signal 246 and the slice portion 222 (which can include the data input signal 226) and generate a set of signals that are coupled to the gates of the NMOS devices 410. Particularly, a first instance of the logic gates 242 generates a first signal corresponding to a first bit of the slice portion 222 and the first signal is coupled to the gate of a first NMOS device of the NMOS devices 410. A second instance of the logic gates 242 generates a second signal corresponding to a second bit of the slice portion 222 and the second signal is coupled to the gate of a second NMOS device of the NMOS devices 410. The logic gates 242 are configured to generate an output signal coupled to the gates of the NMOS devices 410 that is at a VDD voltage level when the slice portion 222 is at a logic high corresponding to the VDD voltage level. The logic gates 242 are configured to generate the output signal, coupled to the gates of the NMOS devices 410, that has a ground voltage level when the slice portion 222 is at a logic low corresponding to the ground voltage level.

In some examples, first nodes (e.g., the sources/drains) of the NMOS devices 410 are coupled together to generate the CASN output signal of the pull-down driver 240. Second nodes (e.g., the sources/drains) of the NMOS devices 410 are coupled together and are configured to receive the ground voltage. The pull-down driver 240 is configured to generate the CASN signal that has a ground voltage level when the slice portion 222 is at a logic high corresponding to the VDD voltage level. The pull-down driver 240 is configured to generate the CASN signal that has a VREFN voltage level when the slice portion 222 is at a logic low corresponding to the ground voltage level.

The CASN signal is coupled to a first node of the NMOS device 260 (e.g., a thin-oxide cascode transistor). A gate 262 of the NMOS device 260 is coupled to the first voltage bias signal 212. A second node of the NMOS device 260 is coupled to the output node 270 and generates the output signal of the interface device 120. In some examples, the NMOS device 260 generates the output signal that transitions between a ground level and the VDDQ level in correspondence with the voltage levels of the data input signal 226. By biasing the gate 262 of the NMOS device 260 with the first voltage bias signal 212, the NMOS device 260 is prevented from operating outside of the operating voltage of the NMOS device 260. Namely, when the first node of the NMOS device 260 is at the VDDQ level, the gate 262 is biased at the second voltage bias signal 214 which prevents a voltage drop between the gate 262 and the first node from exceeding the maximum operating voltage of the NMOS device 260.

The cascode thin-oxide PMOS device 250 used in the pull-up driver 230 help to limit the drain voltage of pull-up driver 230 so that the thin-oxide PMOS devices 234 used in the pull-up driver 230 will not cross the Vds voltage stress limit. The gate voltage of the cascode thin-oxide PMOS device 250 is connected to reference voltage VREFP (e.g., second voltage bias signal 214) which ensures that the voltage stress across the cascode thin-oxide PMOS devices will not cross the reliability limit. The PVT controlled pull-up driver 230 uses multiple parallel branches which get enabled or disabled depending on the PVTP codes (e.g., PVTP control signal 236) generated by a PVT calibration cell. The cascode thin-oxide NMOS device 260 used in the pull-down driver 240 helps to limit the drain voltage of PVT controlled pull-down driver 240 so that the thin-oxide NMOS devices 244 used in the pull-down driver 240 will not cross the Vds voltage stress limit. The charge pump-based level shifter (e.g., logic gates 242) is used to level shift the logic level 0 of the VDD level input signal into the VDDQ level so that it can be used to enable or disable the PVT controlled pull-up driver 230 without crossing the voltage stress across the thin-oxide PMOS device 234 devices used in the pull-up driver 230. The gate voltage of cascode thin-oxide NMOS devices 260 is connected to reference voltage VREFN (e.g., first voltage bias signal 212) which ensures that the voltage stress across the cascode thin-oxide NMOS devices 260 will not cross the reliability limit. The PVT controlled pull-down driver 240 uses multiple parallel branches which will get enabled or disabled depending on the PVTN codes (e.g., PVTN control signal 246) generated by a PVT calibration cell.

Figure 6:
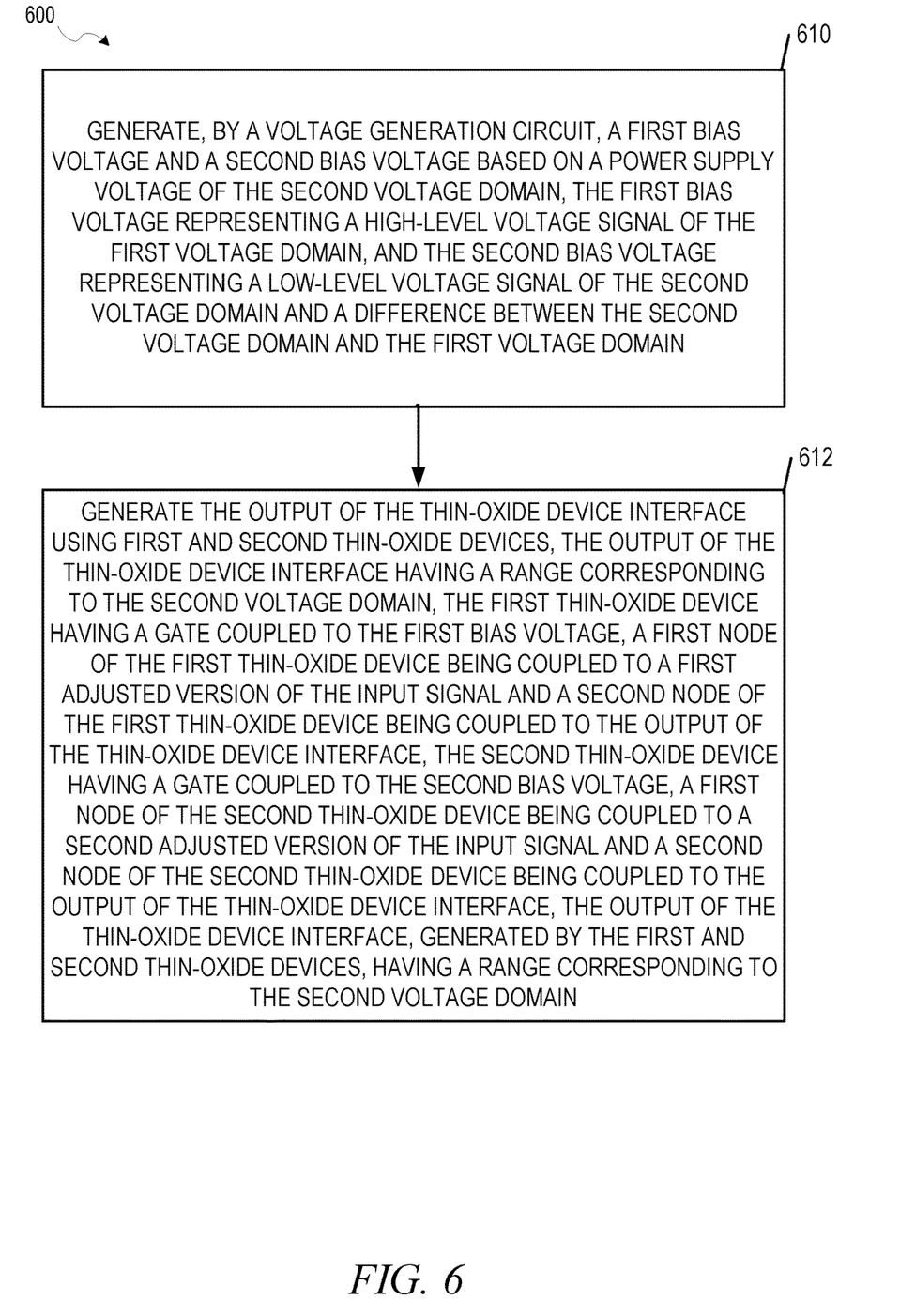
FIGS. 6 and 7 illustrate example methods for exchanging signals between thin-oxide devices operating on a low-voltage domain and thick-oxide devices operating on a high-voltage domain, in accordance with some embodiments.

FIG. 6 illustrates a method 600 for transmitting signals between thin-oxide and thick-oxide devices, according to some embodiments of the present disclosure. The method 600 begins with operation 610 where a first bias voltage and a second bias voltage are generated, by a voltage generation circuit, based on a power supply voltage of the second voltage domain, the first bias voltage value representing a high-level voltage signal of the first voltage domain, and the second bias voltage representing a low-level voltage signal of the second voltage domain and its value corresponds to a difference between the second voltage domain and the first voltage domain. Then, at operation 612, the output of the thin-oxide device interface is generated using first and second thin-oxide devices, the output of the thin-oxide device interface having a range corresponding to the second voltage domain, the first thin-oxide device having a gate coupled to the first bias voltage, a first node of the first thin-oxide device being coupled to a first adjusted version of the input signal and a second node of the first thin-oxide device being coupled to the output of the thin-oxide device interface, the second thin-oxide device having a gate coupled to the second bias voltage, a first node of the second thin-oxide device being coupled to a second adjusted version of the input signal and a second node of the second thin-oxide device being coupled to the output of the thin-oxide device interface.

Figure 7:
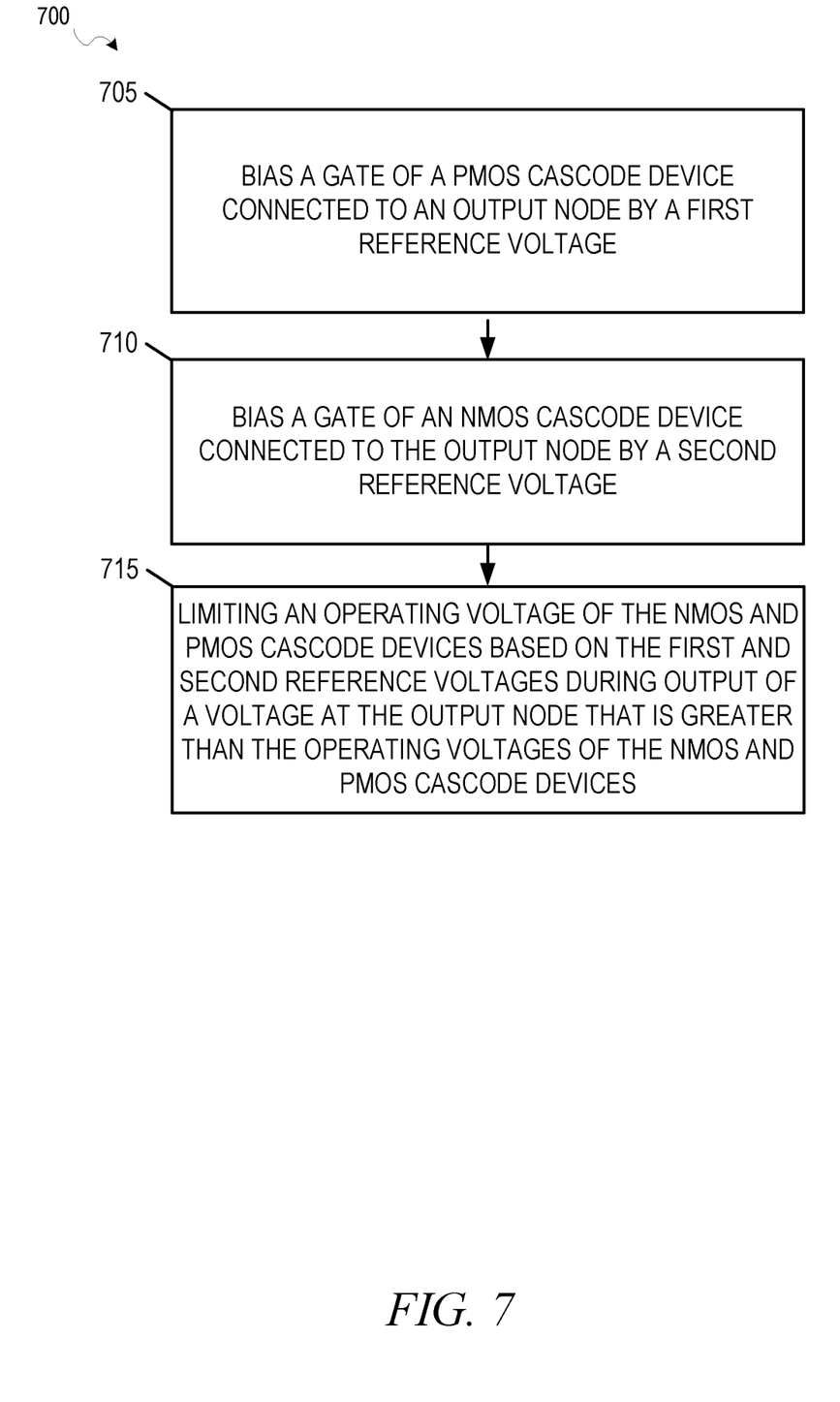

FIG. 7 illustrates a method 700 for transmitting signals between thin-oxide and thick-oxide devices, according to some embodiments of the present disclosure. The method 700 begins with operation 705 where a gate of a PMOS cascode device connected to an output node of the interface device is biased by a first reference voltage. Then, at operation 710, a gate of an NMOS cascode device connected to the output node of the interface device is biased by a second reference voltage. At operation 715, an operating voltage of the NMOS and PMOS cascode devices is limited or restricted based on the first and second reference voltages during output of a voltage at the output node that is greater than the operating voltages of the NMOS and PMOS cascode devices.

Figure 8:
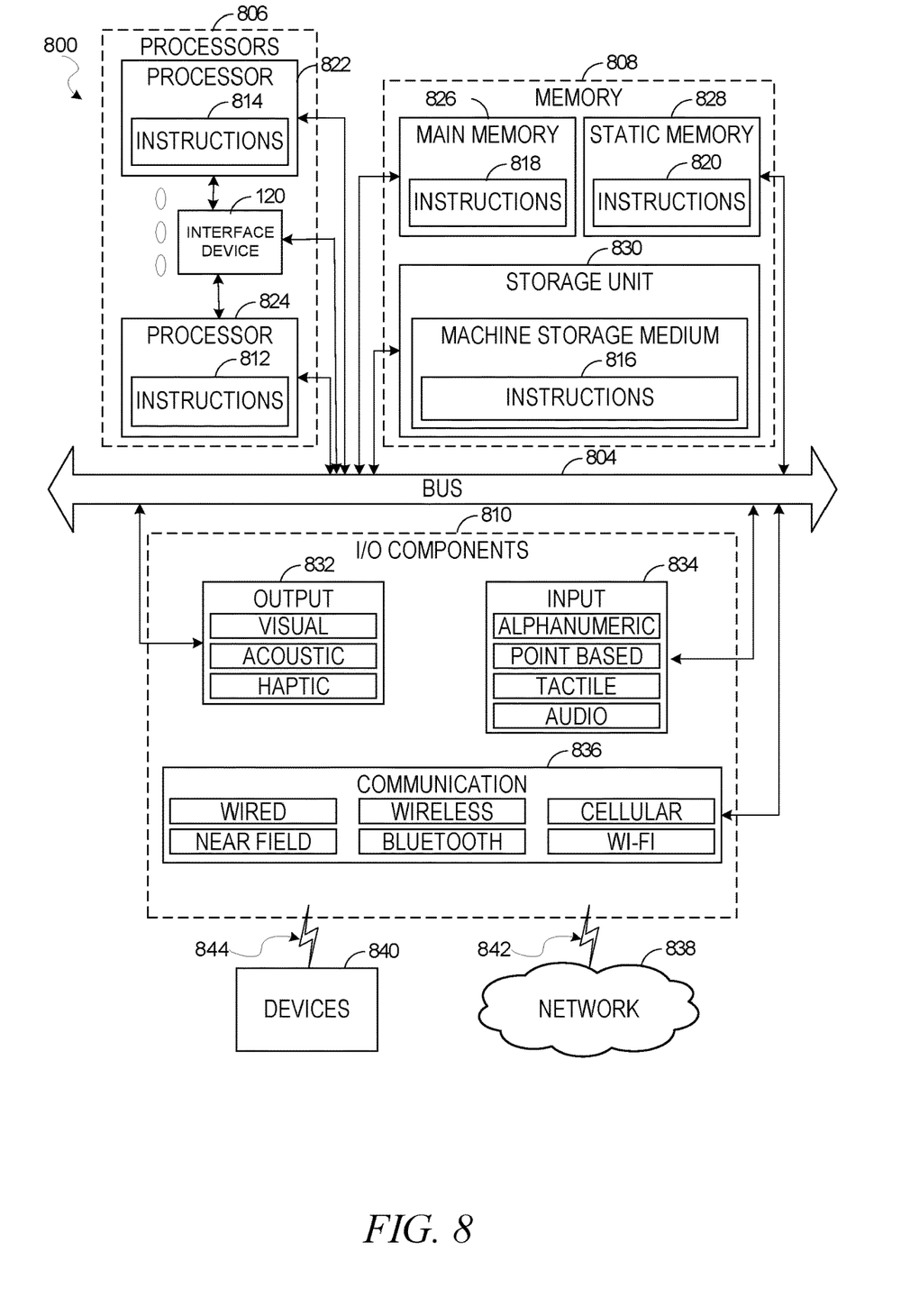
FIG. 8 is a functional block diagram of an example computing system for carrying out methods and operations described herein, in accordance with some embodiments.

FIG. 8 is a functional block diagram of a computing system 800 for executing method 600 and other processes described above, along with other embodiments of the present disclosure. The computing system 800 may execute an EDA software system and for performing the methods 600 or 700, and other processes described above, in accordance with some embodiments of the present disclosure. A machine is shown in the form of the computer system 800 within which a set of instructions may be executed for causing the machine to perform any one or more of the methods 600 or 700 and other methodologies discussed herein, according to some embodiments. Specifically, FIG. 8 shows a diagrammatic representation of the machine in the example form of a computer system. The machine may include a bus 804, processors 806, memory 808, and I/O components 810, which may be configured to communicate with each other such as via the bus.

The machine may include instructions 812-820 (e.g., software, a program, an application, an applet, an app, or other executable code) for causing the machine to perform any one or more of the methodologies discussed herein. For example, the instructions 812-820 may cause the machine to execute an EDA software system that executes the above processes described in the above description. The instructions 812-820 transform the general, non-programmed machine into a particular machine programmed to carry out the described and illustrated functions in the manner described here. In alternative embodiments, the machine operates as a standalone device or may be coupled (e.g., networked) to other machines. In a networked deployment, the machine may operate in the capacity of a server machine or a client machine in a server-client network environment, or as a peer machine in a peer-to-peer (or distributed) network environment. The machine may comprise, but not be limited to, a server computer, a client computer, a personal computer (PC), a tablet computer, a laptop computer, a netbook, a smart phone, a mobile device, a network router, a network switch, a network bridge, or any machine capable of executing the instructions 812-820, sequentially or otherwise, that specify actions to be taken by the machine. Further, while only a single machine is illustrated, the term "machine" shall also be taken to include a collection of machines that individually or jointly execute the instructions 812-820 to perform any one or more of the methodologies discussed herein.

In an example embodiment, the processors 806 (e.g., a central processing unit (CPU), a reduced instruction set computing (RISC) processor, a complex instruction set computing (CISC) processor, a graphics processing unit (GPU), a digital signal processor (DSP), an application-specific integrated circuit (ASIC), a radio-frequency integrated circuit (RFIC), another processor, or any suitable combination thereof) may include, for example, a processor 822 and a processor 824 that may execute the instructions 814 and 812. The term "processor" is intended to include multi-core processors 806 that may comprise two or more independent processors (sometimes referred to as "cores") that may execute instructions contemporaneously. Although FIG. 8 shows multiple processors 806, the machine 802 may include a single processor with a single core, a single processor with multiple cores (e.g., a multi-core processor), multiple processors with a single core, multiple processors with multiple cores, or any combination thereof.

The memory 808 may include a main memory 826, a static memory 828, and a storage unit 830, both accessible to the processors 806 such as via the bus 804. The main memory 826, the static memory 828, and the storage unit 830 store the instructions 816-820 embodying any one or more of the processes, methodologies or functions described herein. The instructions 812-820 may also reside, completely or partially, within the main memory 826, within the static memory 828, within the storage unit 830, within at least one of the processors 806 (e.g., within the processor's cache memory), or any suitable combination thereof, during execution thereof by the machine 802.

The I/O components 810 may include a wide variety of components to receive input, provide output, produce output, transmit information, exchange information, capture measurements, and so on. The specific I/O components 810 that are included in a particular machine will depend on the type of machine. For example, portable machines such as mobile phones will likely include a touch input device or other such input mechanisms, while a headless server machine will likely not include such a touch input device. It will be appreciated that the I/O components 810 may include many other components that are not shown in FIG. 8. The I/O components 810 are grouped according to functionality merely for simplifying the following discussion and the grouping is in no way limiting. In various example embodiments, the I/O components 810 may include output components 832 and input components 834. The output components 832 may include visual components (e.g., a display such as a plasma display panel (PDP), a light emitting diode (LED) display, a liquid crystal display (LCD), a projector, or a cathode ray tube (CRT)), acoustic components (e.g., speakers), other signal generators, and so forth. The input components 834 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

Communication may be implemented using a wide variety of technologies. The I/O components 810 may include communication components 836 operable to couple the machine 802 to a network 838 or devices 840 via a coupling 842 and a coupling 844, respectively. For example, the communication components 836 may include a network interface component or another suitable device to interface with the network 838. In further examples, the communication components 836 may include wired communication components, wireless communication components, cellular communication components, and other communication components to provide communication via other modalities. The devices 840 may be another machine or any of a wide variety of peripheral devices (e.g., a peripheral device coupled via a universal serial bus (USB)).

Executable Instructions and Machine Storage Medium

The various memories (e.g., 808, 818, 820 and/or memory of the processor(s) 806, 822, 824) and/or the storage unit 830 may store one or more sets of instructions and data structures (e.g., software) embodied or utilized by any one or more of the methodologies or functions described herein. These instructions, when executed by the processor(s) 806, cause various operations to implement the disclosed embodiments.

As used herein, the terms "machine-storage medium," "device-storage medium," and "non-transitory computer-storage medium" mean the same thing and may be used interchangeably in this disclosure. The terms refer to a single or multiple storage devices and/or media (e.g., a centralized or distributed database, and/or associated caches and servers) that store executable instructions and/or data. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate arrays (FPGAs), and flash memory devices; magnetic disks such as internal hard disks and removable disks; magneto-optical disks; and CD-ROM and DVD-ROM disks. The terms "machine-storage media, "computer-storage media," and "device-storage media" specifically exclude carrier waves, modulated data signals, and other such media, at least some of which are covered under the term "signal medium" discussed below.

Transmission Medium

In various example embodiments, one or more portions of the network 838 may be an ad hoc network, an intranet, an extranet, a virtual private network (VPN), a local-area network (LAN), a wireless LAN (WLAN), a wide-area network (WAN), a wireless WAN (WWAN), a metropolitan-area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 838 or a portion of the network 838 may include a wireless or cellular network, and the coupling 842 may be a Code Division Multiple Access (CDMA) connection, a Global System for Mobile communications (GSM) connection, or another type of cellular or wireless coupling. In this example, the coupling 842 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long-range protocols, or other data transfer technology.

The instructions 812-820 may be transmitted or received over the network 838 using a transmission medium via a network interface device (e.g., a network interface component included in the communication components 836) and utilizing any one of a number of well-known transfer protocols (e.g., hypertext transfer protocol (HTTP)). Similarly, the instructions 812-820 may be transmitted or received using a transmission medium via the coupling 844 (e.g., a peer-to-peer coupling) to the devices 840. The terms "transmission medium" and "signal medium" mean the same thing and may be used interchangeably in this disclosure. The terms "transmission medium" and "signal medium" shall be taken to include any intangible medium that is capable of storing, encoding, or carrying the instructions 812-820 for execution by the machine 802, and include digital or analog communications signals or other intangible media to facilitate communication of such software. Hence, the terms "transmission medium" and "signal medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium," and "device-readable medium" mean the same thing and may be used interchangeably in this disclosure. The terms are defined to include both machine-storage media and transmission media. Thus, the terms include both storage devices/media (non-transitory computer readable media or medium) and carrier waves/modulated data signals.

The various operations of example methods described herein may be performed, at least partially, by one or more processors that are temporarily configured (e.g., by software) or permanently configured to perform the relevant operations. Similarly, the methods described herein may be at least partially processor implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, method or process that includes elements in addition to those listed after such a term in a claim is still deemed to fall within the scope of that claim.

What is claimed is:

1. An interface device comprising:
   a voltage generation circuit configured to generate a first bias voltage and a second bias voltage, a value of the first bias voltage representing a high-level voltage signal of a first voltage domain at which a first component operates, a value of the second bias voltage representing a low-level voltage signal of a second voltage domain at which a second component operates, the second bias voltage value representing a difference between the second voltage domain and the first voltage domain, and the first bias voltage and the second bias voltage being generated based on a power supply voltage of the second voltage domain;
   a first thin-oxide device having a gate coupled to the voltage generation circuit to receive the first bias voltage, a first node of the first thin-oxide device being configured to receive a first adjusted version of an input signal provided by the first component; and
   a second thin-oxide device having a gate coupled to the voltage generation circuit to receive the second bias voltage, a first node of the second thin-oxide device being configured to receive a second adjusted version of the input signal, a second node of the first thin-oxide device and a second node of the second thin-oxide device being operatively coupled to an output node to provide an output signal to the second component, the second adjusted version of the input signal generated by a pull-up driver comprising a plurality of transistors, the plurality of transistors having corresponding gates coupled to respective bits of the input signal and having respective nodes coupled together to generate the second adjusted version of the input signal, the respective nodes of the plurality of transistors being connected to the first node of the second thin-oxide device and transitioning between the second bias voltage and the power supply voltage of the second voltage domain.

2. The interface device of claim 1, wherein the output signal, generated by the first and second thin-oxide devices, has a range corresponding to the second voltage domain, and wherein the first voltage domain corresponds to a first operating level of thin-oxide devices and the second voltage domain corresponds to a second operating level of one or more thick-oxide devices.

3. The interface device of claim 1, wherein the first component comprises a processor coupled to a memory interface that comprises the voltage generation circuit, the first thin-oxide device, and the second thin-oxide device.

4. The interface device of claim 3, wherein the second component comprises a memory device.

5. The interface device of claim 1, wherein the pull-up driver comprises a plurality of cascode thin-oxide PMOS devices.

6. The interface device of claim 1, comprising:
   a pull-down driver configured to receive the input signal and generate the first adjusted version of the input signal, the first adjusted version of the input signal transitioning between a ground voltage to represent a high logic level of the input signal and the first bias voltage to represent a low logic level of the input signal.

7. The interface device of claim 6, wherein the pull-down driver comprises a plurality of cascode thin-oxide NMOS devices having respective output nodes coupled together to provide the first adjusted version of the input signal, each gate of the plurality of cascode thin-oxide NMOS devices being coupled to the respective bits of the input signal.

8. The interface device of claim 1, wherein the pull-up driver is configured to generate the second adjusted version of the input signal based on a value corresponding to manufacturing process, voltage and temperature parameters of the pull-up driver.

9. The interface device of claim 6, wherein the pull-down driver is configured to generate the first adjusted version of the input signal based on a value corresponding to manufacturing process, voltage and temperature parameters of the pull-down driver.

10. The interface device of claim 9, wherein individual branches of transistors within the pull-down driver are selectively enabled based on the value corresponding to the manufacturing process, voltage and temperature parameters.

11. The interface device of claim 6, comprising:
a charge pump level shifter, the pull-up driver being configured to receive the input signal via the charge pump level shifter, the charge pump level shifter being configured to adjust a level of the input signal such that the high logic level of the input signal is represented by the power supply voltage of the second voltage domain and the low logic level of the input signal is represented by the second bias voltage.

12. The interface device of claim 6, comprising:
buffers, the pull-down driver being configured to receive the input signal via the buffers, the buffers being configured to adjust a level of the input signal such that the high logic level of the input signal is represented by the first bias voltage and the low logic level of the input signal is represented by the ground voltage.

13. The interface device of claim 1, wherein the first thin-oxide device comprises a cascode PMOS transistor, and wherein the second thin-oxide device comprises a cascode NMOS transistor.

14. The interface device of claim 1, wherein a portion of a device interface comprises the first and second thin-oxide device, the portion corresponding to a first data slice of the input signal, wherein the voltage generation circuit comprises:
a first voltage divider configured to generate a common reference voltage comprising the first bias voltage and the second bias voltage, the common reference voltage being distributed to a plurality of portions of the device interface, each portion of the plurality of portions corresponding to a different data slice of a plurality of data slices of the input signal; and
a second voltage divider configured to generate a distributed reference voltage for each bit of the input signal within each of the plurality of portions, the distributed reference voltage comprising the first bias voltage and the second bias voltage.

15. The interface device of claim 14, wherein the second voltage divider comprises first and second transistors coupled to an output of a level shifter of the device interface, a gate of the first transistor being configured to receive a first signal that transitions between the power supply voltage of the second voltage domain and the second bias voltage, and a gate of the second transistor being configured to receive a second signal that transitions between the first bias voltage and ground.

16. The interface device of claim 15, wherein the first and the second transistors selectively enable the second voltage divider.

17. A method comprising:
generating, by a voltage generation circuit, a first bias voltage and a second bias voltage, a value of the first bias voltage representing a high-level voltage signal of a first voltage domain at which a first component operates, a value of the second bias voltage representing a low-level voltage signal of a second voltage domain at which a second component operates, the second bias voltage value representing a difference between the second voltage domain and the first voltage domain, and the first bias voltage and the second bias voltage being generated based on a power supply voltage of the second voltage domain; and
generating an output signal coupled to the second component using first and second thin-oxide devices coupled to the voltage generation circuit, the output signal having a range corresponding to the second voltage domain, the first thin-oxide device having a gate coupled to the first bias voltage, a first node of the first thin-oxide device being coupled to a first adjusted version of an input signal provided by the first component, the second thin-oxide device having a gate coupled to the second bias voltage, a first node of the second thin-oxide device being coupled to a second adjusted version of the input signal, a second node of the first thin-oxide device and a second node of the second thin-oxide device being coupled to an output node to provide the output signal to the second component, the second adjusted version of the input signal generated by a pull-up driver comprising a plurality of transistors, the plurality of transistors having corresponding gates coupled to respective bits of the input signal and having respective nodes coupled together to generate the second adjusted version of the input signal, the respective nodes of the plurality of transistors being connected to the first node of the second thin-oxide device and transitioning between the second bias voltage and the power supply voltage of the second voltage domain.

18. The method of claim 17, comprising:
generating, by a first voltage divider, a common reference voltage comprising the first bias voltage and the second bias voltage, the common reference voltage being distributed to a plurality of portions of a device interface, each portion of the plurality of portions corresponding to a different data slice of a plurality of data slices of the input signal.

19. An apparatus comprising:
means for generating, by a voltage generation circuit, a first bias voltage and a second bias voltage, a value of the first bias voltage representing a high-level voltage signal of a first voltage domain at which a first component operates, a value of the second bias voltage representing a low-level voltage signal of a second voltage domain at which a second component operates, the second bias voltage value representing a difference between the second voltage domain and the first voltage domain, and the first bias voltage and the second bias voltage being generated based on a power supply voltage of the second voltage domain; and
means for generating an output signal coupled to the second component using first and second thin-oxide devices coupled to the voltage generation circuit, the output signal having a range corresponding to the second voltage domain, the first thin-oxide device having a gate coupled to the first bias voltage, a first node of the first thin-oxide device being coupled to a first adjusted version of an input signal provided by the first component, the second thin-oxide device having a gate coupled to the second bias voltage, a first node of the second thin-oxide device being coupled to a second adjusted version of the input signal, a second node of the first thin-oxide device and a second node of the second thin-oxide device being coupled to an output node to provide the output signal to the second component, the second adjusted version of the input signal generated by a pull-up driver comprising a plurality of transistors, the plurality of transistors having corresponding gates coupled to respective bits of the input signal and having respective nodes coupled together to generate the second adjusted version of the input signal, the respective nodes of the plurality of transistors being connected to the first node of the second thin-oxide device and transitioning between the second bias voltage and the power supply voltage of the second voltage domain.

20. The method of claim 18, comprising:

generating, by a second voltage divider, a distributed reference voltage for each bit of the input signal within each of the plurality of portions, the distributed reference voltage comprising the first bias voltage and the second bias voltage.

* * * * *